United States Patent
Chang

(10) Patent No.: US 6,870,250 B2
(45) Date of Patent: Mar. 22, 2005

(54) CHIP PACKAGE STRUCTURE HAVING π FILTER

(75) Inventor: Nai-Shung Chang, Taipei Hsien (TW)

(73) Assignee: VIA Technologies, Inc., Taipei Hsien (TW)

(*) Notice: Subject to any disclaimer, the term of this patent is extended or adjusted under 35 U.S.C. 154(b) by 1 day.

(21) Appl. No.: 10/217,347

(22) Filed: Aug. 8, 2002

(65) Prior Publication Data

US 2003/0219925 A1 Nov. 27, 2003

(30) Foreign Application Priority Data

May 22, 2002 (TW) ........................................ 91110707 A

(51) Int. Cl.[7] .............................................. H01L 23/48
(52) U.S. Cl. ...................... 257/690; 257/664; 257/676; 257/700
(58) Field of Search ................................. 257/664–666, 257/676, 690–697, 700; 438/123, 215

(56) References Cited

U.S. PATENT DOCUMENTS

| | | | |
|---|---|---|---|
| 6,049,702 A | * | 4/2000 | Tham et al. ................... 455/78 |
| 6,124,625 A | * | 9/2000 | Chern et al. ................. 257/532 |
| 2001/0024360 A1 | * | 9/2001 | Hirata et al. ................. 361/780 |
| 2001/0042899 A1 | * | 11/2001 | Protigal et al. ............. 257/535 |

FOREIGN PATENT DOCUMENTS

JP  7074322 A  *  8/1993  ........... H01L/27/24

* cited by examiner

Primary Examiner—Carl Whitehead, Jr.
Assistant Examiner—Yennhu B. Huynh
(74) Attorney, Agent, or Firm—J.C. Patents

(57) ABSTRACT

A chip package structure having a substrate therein for accommodating a die. Power regions supplying power to various control units within the die are grouped together into at least two sections. At least one π filter is used to isolate different power regions on the substrate so that cross interference of noise signals are reduced and stability of the chip is improved. The π filter is positioned close to one of the corners of the substrate so that the layout of wiring on the substrate is facilitated.

11 Claims, 2 Drawing Sheets

CHIP PACKAGE STRUCTURE HAVING π FILTER

CROSS-REFERENCE TO RELATED APPLICATION

This application claims the priority benefit of Taiwan application serial no. 91110707, filed May 22, 2002.

BACKGROUND OF THE INVENTION

1. Field of Invention

The present invention relates to a semiconductor package structure. More particularly, the present invention relates to a chip package structure and a substrate within the package structure.

2. Description of Related Art

At present, manufacturing technologies for fabricating semiconductor devices are progressing at a tremendous pace. Consequently, the level of integration for integrated circuit (IC) chips has advanced in stages from small-scale integration (SSI) to large-scale integration (LSI) or even ultra-large scale integration (ULSI). No matter what the applications actually are for, these integrated circuits are formed by various fabrication techniques on a silicon wafer. The total number of usable integrated circuits in each wafer depends on the type of fabrication techniques and the gate counts of the each integrated circuit. The wafer is later diced up into dies each having a complete integrated circuit unit. Thereafter, the die is packaged within a plastic body that can be attached to a conventional printed circuit board (PCB).

Due to rapid increase in the level of integration, each integrated circuit has increasingly complicated functional capabilities. Hence, the number of input/output (I/O) leads from a package required for external connection must be increased. To accommodate additional connections, the packaging design must be revised and continuously improved. Earlier quad flat pack (QFP) where the die is attached to a lead frame no longer can meet the pin count of later versions of highly integrated chips. Even the capacity of a later version such as the pin-grid array cannot meet the large pin count demanded by a modem chip. Therefore, a package based on attaching a die on a small piece of printed circuit board or substrate known as a ball grid array (BGA) package has been developed. Since the introduction of BGA packages for housing high pin count integrated circuit chips, it has become the dominant packaging technique.

FIG. 1 is a diagram showing the substrate of a conventional north bridge chip package. In FIG. 1, only the surface of the substrate 100 for attaching a die is shown. Furthermore, to simplify the identification of components, wire-bonding pads for connection to contact pads on the die and wiring for distributing signals from the I/O leads of the die are omitted.

In general, the north bridge chip is connected to a central processing unit (CPU), an accelerated graphic port (AGP), a system memory and a south bridge chip. Hence, the north bridge chip must include a central processing control unit, an accelerated graphic port control unit, a memory control unit and a south bridge chip control unit (not shown). Since the input/output (I/O) ports of the north bridge chip have to transmit signals to various I/O ports of connected devices, the substrate 100 within the north bridge chip must also supply power to the devices.

As shown in FIG. 1, the north bridge chip has a power layout that includes a ground region 110 and a plurality of power source regions 120, 130, 140, 150 and 160. The ground region 110 is used for attaching a die and ground leads of the die. The power source 120 provides a supply power ($V_{cc1}$) to the input/output (I/O) section of the accelerated graphic port control unit of the die. In general, the power source 120 provides 1.5V. The power source 130 provides a supply power ($V_{cc2}$) to the input/output (I/O) section of the south bridge chip control unit. In general, the power source 130 provides 1.5V. The power source 140 provides a to supply power ($V_{cc3}$) to the input/output (I/O) section of the memory control unit. In general, the power source 140 provides 2.5V. The power source 150 provides a supply power ($V_{tt}$) to the input/output (I/O) section of the central processing control unit. In general, the power source 150 provides 1.5V. The power source 160 provides a supply power ($V_{core}$) to the core section of various units within the die. In general, the power source 160 provides 2.5V.

To transmit signals from a unit within the north bridge chip to an external device, the voltage between the external device and the I/O ports of unit need to be transformed. FIG. 2 is the diagram of a conventional signal driving circuit. In FIG. 2, the input signal $S_{in}$ passes through a core driver 210 and an I/O driver 220 as an output signal $S_{out}$. The voltage $V_{core}$ powers the core driver 210 while the voltage $V_{tt}$ powers the I/O driver 220. As seen from FIGS. 1 and 2, the substrate of a conventional north bridge chip package structure has no provision for isolating the power at the core section of various control units. Hence, the voltage at the core section of the power source 160 may fluctuate when subjected to a high frequency signal. Fluctuation in the power source may directly interfere with the operations of other units within the north bridge and ultimately lead to circuit instability.

SUMMARY OF THE INVENTION

Accordingly, one object of the present invention is to provide a chip package structure having a substrate capable of isolating different power source regions and preventing cross interference between noise signals so that the chip may operate in a stable state.

To achieve these and other advantages and in accordance with the purpose of the invention, as embodied and broadly described herein, the invention provides a chip package structure. The chip package structure includes a die and a substrate. The substrate is a base for attaching a die. The substrate provides the die with a wiring distribution and has a π filter for isolating different core power regions within the substrate. The substrate further includes a first core power region that provides power to a first circuit section of the die and a second core power region that provides power to a second circuit section of the die.

In this embodiment, the π filter further has a first capacitor having a first terminal connected to the first core power region and a second terminal connected to ground; a second capacitor having a first terminal connected to the second core power region and a second terminal connected to ground; and an inductor having a first terminal connected to the first core power region and a second terminal connected to the second core power region. The terminals of an inductor inside the π filter are connected to the first core power region and the second core power region respectively. The capacitance of the first capacitor or the second capacitor is about 0.1 μF and the inductor has an inductance of about 100 Ω at a standard operating frequency of 1.6 GHz.

Preferably, the π filter further includes a third capacitor having a capacitance about 0.001 μF. One terminal of the capacitor is coupled to the second power source while the other terminal is connected to ground. The capacitor is positioned on two edge junctions at the corners of the substrate.

In brief, this invention provides a chip package structure having a substrate with at least one π filter for isolating different power regions. Ultimately, cross interference of noise signals is prevented and chip operation is stabilized.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
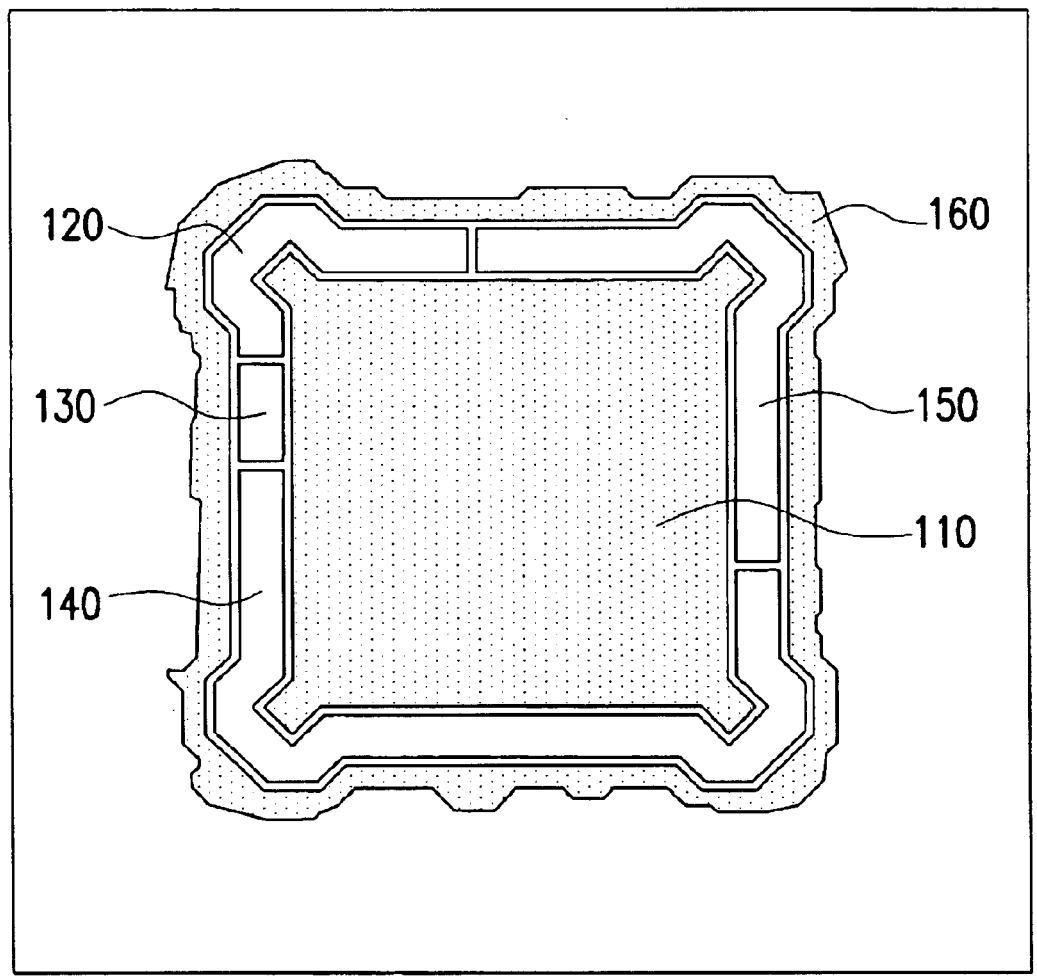
FIG. 1 is a diagram showing the substrate of a conventional north bridge chip package structure.
Figure 2:
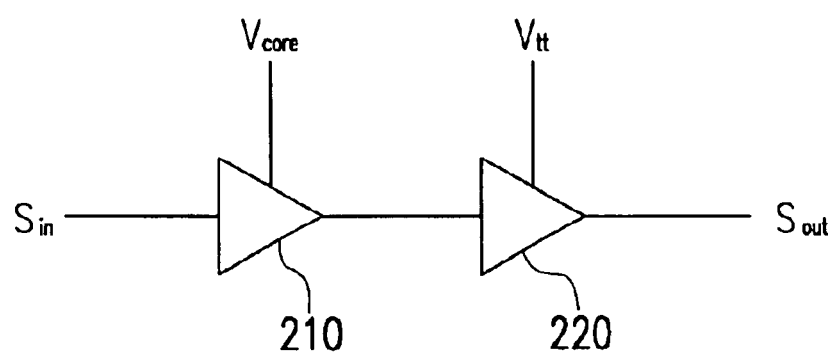
FIG. 2 is the diagram of a conventional signal driving circuit.

Reference will now be made in detail to the present preferred embodiments of the invention, examples of which are illustrated in the accompanying drawings. Wherever possible, the same reference numbers are used in the drawings and the description to refer to the same or like parts.

Figure 3:
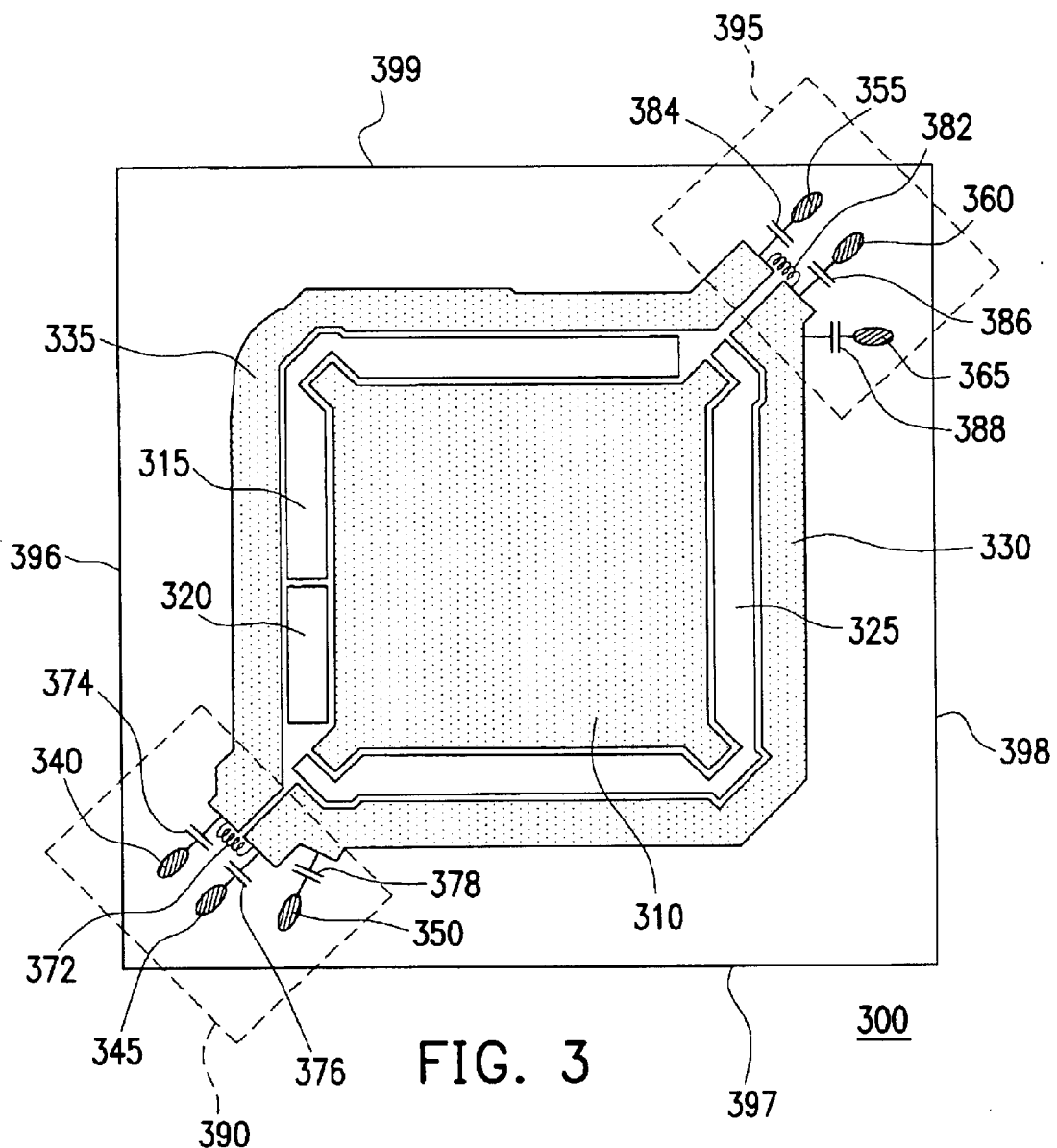
FIG. 3 is a schematic diagram showing a substrate within a chip package structure according to one preferred embodiment of this invention.

FIG. 3 is a schematic diagram showing a substrate within a chip package structure according to one preferred embodiment of this invention. In FIG. 3, only the surface of the substrate 300 for attaching a die is shown. Furthermore, to simplify the identification of components, wire-bonding pads for connection to contact pads on the die and wiring for distributing signals from the I/O leads of the die are omitted. The die of a north bridge chip manufactured by AMD as its K8 series is used as an illustration. In addition, the package has a wire-bonded BGA package structure. However, anyone familiar with the technologies may apply the technique of this invention to other types of die having a different package structure.

In general, the north bridge chip of AMD's K8 series is connected to a central processing unit (CPU), an accelerated graphic port (AGP) and a south bridge chip. Hence, the north bridge chip must include a central processing control unit, an accelerated graphic port control unit and a south bridge chip control unit (not shown). Since the input/output (I/O) ports of the north bridge chip have to transmit signals to and from various I/O ports of connected devices, the substrate 300 within the north bridge chip must also supply power to these devices.

As shown in FIG. 3, the north bridge chip has a power layout that includes a ground region 310 and a plurality of power source regions 315, 320, 325, 330 and 335. The ground region 310 is used for attaching a die and ground leads of the die. The power source 315 provides a supply power ($V_{cc1}$) to the input/output (I/O) section of the accelerated graphic port control unit of the die. In general, the power source 315 provides 1.5V. The power source 320 provides a supply power ($V_{cc2}$) to the input/output (I/O) section of the south bridge chip control unit. In general, the power source 320 provides 1.5V. The power source 325 provides a supply power ($V_{tt}$) to the input/output (I/O) section of the central processing control unit. In general, the power source 325 provides 1.5V.

In this invention, the power regions connected to the core sections of various units within the die are divided into a first core power region 330 and a second core power region 335. Both power regions provide a voltage of about 2.5V. The first core power source 330 provides a supply power ($V_{core1}$) to the core section of central processing control unit of the die. The second core power source 335 provides a to supply power ($V_{core2}$) to the core section of the accelerated graphic port control unit and the core section of the south bridge chip control unit of the die. To isolate the first core power region 330 from the second core power region 335 and increase in-operation stability of the chip, a π filter 390 is inserted to the corner between the sides 396 and 397 of the substrate 300. Another π filter 395 is inserted to the corner between the sides 398 and 399 of the substrate 300. The π filter 390 at least includes two capacitors 374, 376 and an inductor 372. The capacitor 374 connects the second core power region 335 and the ground region 340. The capacitor 376 connects between the first core power region 330 and the ground region 345. The inductor 372 connects between the first core power region 330 and the second core power region 335. Similarly, the π filter 395 at least includes two capacitors 384, 386 and an inductor 382. The capacitor 384 connects between the second core power region 335 and the ground region 355. The capacitor 386 connects between the first core power region 330 and the ground region 360. The inductor 382 connects between the first core power region 330 and the second core power region 335. In this embodiment, the π filters 390 and 395 also include capacitors 378 and 388 connecting between the first core power region 330 and the ground regions 350 and 365 respectively.

Figure 4:
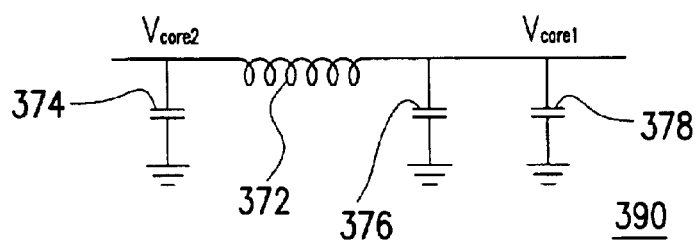
FIG. 4 is an equivalent circuit diagram of the π filter inside the chip package structure according to this invention.

FIG. 4 is an equivalent circuit diagram of the π filter inside the chip package structure according to this invention. Here, the π filter 390 in FIG. 3 is used as an example to facilitate the following explanation. As shown in FIG. 4, the π filter 390 includes three capacitors 374, 376 and 378 on two side of an inductor 372. Preferably, the capacitors 374 and 376 each have a capacitance of about 0.1 $\mu F$ and the capacitor 378 has a capacitance of about 0.001 $\mu F$. The inductor 372 has an inductance of about 100 Ω when operating at a standard frequency of 1.6 GHz. Obviously, anyone familiar with circuit design may vary the values according to different requirements. When the voltage at the first core power region ($V_{core1}$) or the second core power region ($V_{core2}$) fluctuates at a high frequency, the inductor 372 effectively blocks out any fluctuation in the other core power region.

In general, a functionally powerful semiconductor circuit generally consumes more power and the effect of noise interference increases correspondingly. The substrate fabricated according to this invention is able to isolate out the source of noise interference so that the chip may operate under a stable condition.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A substrate inside a chip package structure for accommodating a die, comprising:
   a first core power region for providing power to a first circuit section of the die, wherein the first core power region is located at a portion of a periphery of a central ground region under the die;
   a second core power region for providing power to a second circuit section of the die, wherein the first core power region and the second core power region supply an identical voltage, wherein the second core power region is located at another portion of the periphery of the central ground region, wherein one end of the first core power region is adjacent to one end of the second core power region; and
   a π filter coupled to the adjacent two ends of the first power source region and the second power source region.

2. The structure of claim 1, wherein the π filter further comprising:
   a first capacitor having a first terminal connected to the first core power region and a second terminal connected to ground;
   a second capacitor having a first terminal connected to the second core power region and a second terminal connected to ground; and
   an inductor having a first terminal connected to the first core power region and a second terminal connected to the second core power region.

3. The structure of claim 2, wherein the substrate further includes a third capacitor having a first terminal connected to the first core power region and a second terminal connected to ground.

4. The structure of claim 1, wherein the die is a die inside a north bridge chip.

5. The structure of claim 4, wherein the second circuit section is the central processing control unit within a north bridge chip.

6. The structure of claim 4, wherein the first circuit section is the accelerated graphic port control unit and the south bridge chip control unit within the north bridge chip.

7. The structure of claim 1, wherein the π filter is positioned in the substrate close to the corner where two sides of the package meet.

8. The structure of claim 7, wherein the substrate further includes another π filter positioned close to the corner where the other two sides of the package meet.

9. A substrate inside a chip package structure for accommodating a die, comprising:
   a first core power region for providing power to a first circuit section of the die, wherein the first core power region is located at a portion of a periphery of a central ground region under the die;
   a second core power region for providing power to a second circuit section of the die, wherein the first core power region and the second core power region supply an identical voltage, wherein the second core power region is located at another portion of the periphery of the central ground region, and one end of the first core power region is adjacent to one end of the second core power region; and
   at least one inductor coupled to the adjacent two ends of the first power source region and the second power source region.

10. The chip package structure of claim 9, wherein the substrate further includes:
    a first capacitor having a first terminal connected to the first core power region and a second terminal connected to ground; and
    a second capacitor having a first terminal connected to the second core power region and a second terminal connected to ground.

11. The chip package structure of claim 10, wherein the substrate further includes a third capacitor having a first terminal connected to the first core power region and a second terminal connected to ground.

* * * * *